United States Patent [19]

Matthies

[11] Patent Number: 4,758,879
[45] Date of Patent: Jul. 19, 1988

[54] CIRCUIT ARRANGEMENT FOR CONTROLLING AN OSCILLATOR IN A COLOUR TELEVISION RECEIVER OR A VIDEO RECORDING AND/OR REPRODUCING APPARATUS HAVING A PHASE ALTERNATING SUBCARRIER.

[75] Inventor: Karl-Heinz Matthies, Hamburg, Fed. Rep. of Germany

[73] Assignee: U.S. Philips Corporation, New York, N.Y.

[21] Appl. No.: 13

[22] Filed: Jan. 2, 1987

[51] Int. Cl.$^4$ .............................................. H04N 9/45
[52] U.S. Cl. ..................................... 358/19; 358/24; 358/25
[58] Field of Search ..................... 358/18, 19, 24, 25, 358/26

[56] References Cited

U.S. PATENT DOCUMENTS 4,255,759  3/1981  Ohmori ............................. 358/19
4,561,014 12/1985  Doyziech et al. ................. 358/19

Primary Examiner—John W. Shepperd
Attorney, Agent, or Firm—Algy Tamoshunas; Gregory P. Gadson

[57] ABSTRACT

The invention relates to a circuit arrangement for controlling an oscillator. In a first phase-comparator circuit a burst signal whose phase alternates in a predetermined sequence is compared with a first oscillator signal. The output signal generated by the first phase comparator circuit is superimposed on a correction signal generated in a correction circuit, so as to eliminate fluctuations as a result of the phase alternation of the burst signal. The correction circuit is disabled when the magnitude of the phase difference exceeds a specific limit value.

8 Claims, 2 Drawing Sheets

CIRCUIT ARRANGEMENT FOR CONTROLLING AN OSCILLATOR IN A COLOUR TELEVISION RECEIVER OR A VIDEO RECORDING AND/OR REPRODUCING APPARATUS HAVING A PHASE ALTERNATING SUBCARRIER.

BACKGROUND OF THE INVENTION

The invention relates to a circuit arrangement for controlling the frequency of an oscillator in a color television receiver or a video recording and/or reproducing apparatus, comprising a phase-comparator circuit having a first input for receiving a burst signal, a second input for receiving a first oscillator signal from a reference oscillator coupled to said second input, which phase-comparator circuit is constructed to produce a first output signal on an output depending on the phase difference between the color burst and the first oscillator signal, a correct circuit for generating an amplitude-limited correction signal, a signal-combination circuit for superimposing the correction signal on the first output signal and deriving therefrom a control signal for controlling the oscillator, the control signal being substantially independent of fluctuations as a result of the phase alternation of the burst signal every other line.

Such a circuit arrangement is known from DE-PS No. 32 02 210. Said Patent Specification describes a device for processing a PAL television signal, in which an oscillator signal generated by a reference oscillator and a chrominance signal modulated on a frequency of 4.43 MHz are applied to a phase comparator circuit. The chrominance signal contains the color signal occurring during the horizontal scan and the burst signal occurring during a part of the horizontal flyback. Phase comparison is effected in the time during which the burst signal appears. The output signal of the phase comparator circuit is applied to an adder whose output is connected to a low-pass filter. The low-pass filter supplies a control signal to a frequency-dependent oscillator.

Since in PAL systems the phase of the burst signal changes 90° from line to line, the output signal of the phase comparator circuit also changes at half the line frequency. In order to ensure that this alternating signal does not influence the frequency-dependent oscillator and thereby cause colour changes, the known circuit arrangement comprises a correction circuit which generates a correction signal. This correction signal is added to the output signal of the phase comparator circuit and largely eliminates the fault caused by the alternating signal. The correction circuit comprises a circuit which generates pulses at half the line frequency. These pulses are applied to a current source via a phase inverter to generate a direct current which is superimposed on the output signal of the phase comparator circuit by the adder.

In order to ensure that a signal opposite to the alternating component in the output signal of the phase comparator circuit is applied the output of the low-pass filter in the correction circuit is coupled to a pulse counter via a high-pass filter, a half-wave rectifier and a pulse shaper. This counter counts the pulses in the output signal of the low-pass filter. After the pulse counter has counted four pulses it changes over a multivibrator circuit by means of which the state of the phase inverter is switched over. The pulses of half the line frequency applied to the current source are inverted.

The known circuit arrangement is very intricate and responds slowly in the case of incorrect switching phases, which occur for example during reproduction by means of a video recording and/or reproducing apparatus (for example, monitoring during fast forward operation). The phase of the burst signal is then not shifted by 90° every other line. In the case of such an incorrect switching phase at least 8 line intervals will elapse before the known circuit arrangement is capable of correcting this fault and thus eliminating color faults.

SUMMARY OF THE INVENTION

It is the object of the invention to construct a circuit arrangement of the type defined in the opening paragraph in such a way that a faster control is obtained.

In accordance with the invention this object is achieved in that the correction circuit comprises:
an inverter having an input coupled to the output of the phase comparator circuit, for inverting the first output signal, and
an amplitude limiter, which is coupled to an output of the inverter, and there is also provided a detection circuit for disabling the correction circuit when the magnitude of the phase difference exceeds a predetermined limit value.

In the circuit arrangement in accordance with the invention the correction circuit generates a signal which is inverted with respect to the first output signal of the first phase-comparator circuit. Here, instead of a correction signal being derived from the control signal as in the known intricate circuit arrangement, an inverted first output signal is formed before the superposition. A phase error whose magnitude exceeds a specific limit value is detected in the detection circuit and causes the correction circuit to be disabled. The control signal for the frequency-dependent oscillator is then formed by the first output signal of the first phase-comparator circuit. As the correction circuit is disabled the amplitude of the control signal is increased, resulting in an increased control speed when the circuit arrangement in accordance with the invention is utilized in a phase-locked loop.

It is to be noted that DE-OS No. 31 22 811 describes a circuit arrangement which serves, for example, for clock extraction after receipt of transmitted digital data in telecommunication systems. This is achieved by means of a phase-locked loop comprising a phase-comparator circuit which derives an output signal from the data signal and a reference signal generated by an oscillator, which output signal is applied to a correction circuit. The correction circuit applies the output signal of the phase comparator circuit to the oscillator via a low-pass filter. In the event of spurious pulses the correction circuit transfers an inverted output signal from the phase comparator circuit to the low-pass filter, i.e. when the magnitude of the output signal of the phase-comparator circuit exceeds a predetermined value. In this way the lock-in range of the phase-locked loop is extended.

In the circuit arrangement in accordance with the invention the inverted output signal and the non-inverted output signal of the phase comparator circuit are superimposed only if the magnitude of the output signal of the phase-comparator circuit lies below a predetermined limit value. In the circuit arrangement known from DE-OS No. 31 22 811 the non-inverted output signal of the phase-comparator circuit is replaced by the inverted output signal of the phase comparator circuit if the magnitude of the output signal of the phase-comparator circuit exceeds a predetermined value. Consequently, the known circuit arrangement generates a basically different control signal.

The correction circuit may be constructed in such a way that it comprises an inverter, which inverts the first output signal, and an amplitude limiter, which limits the amplitude of the inverted first output signal and generates the correction signal. The inverted first output signal can also be generated by means of a further phase-comparator circuit in that this circuit compares the burst signal with a further oscillator signal generated by the reference oscillator, which oscillator signal exhibits a specific phase shift relative to the first oscillator signal. A signal identical to the inverted first output signal is then obtained on the output of this phase-comparator circuit.

The amplitude limiter may now be adjusted in such a way that the amplitude of the correction signal applied by the amplitude limiter in the case of a phase difference does not exceed the amplitude of the output signal of the inverter when there is no phase difference. This step ensures that the correction signal only eliminates fluctuations caused by phase alternations of the burst signal. The control signal components which define the phase error are not influenced.

The detection circuit may comprise a phase-comparator circuit and a threshold detector, which phase-comparator circuit generates a second output signal depending on the burst signal and a second oscillator signal generated in the reference oscillator, which second oscillator signal has a fixed phase difference relative to the first oscillator signal, a disable signal for disabling correction circuit being derived from the threshold detector when the magnitude of the phase difference exceeds a predetermined limit. Relative to the first oscillator signal the second oscillator signal must have such a phase difference that only in the case of specific phase errors the threshold detector generates a signal from which the disable signal for the correction circuit is derived. For example, there may a phase difference of 90° between the first and the second oscillator signal. When the correction circuit is disabled the first output signal constitutes the control signal for the frequency-dependent oscillator.

The detection circuit may be constructed in such a way that the output of the threshold detector is connected to the set input of a multivibrator circuit which generates the disable signal.

Further, the output of the second phase-comparator circuit may be coupled to a color killer.

BRIEF DESCRIPTION OF THE DRAWING

Embodiments of the invention will now be described in more detail, by way of example, with reference to the accompanying drawings, in which.

DETAILED DESCRIPTION OF THE INVENTION

Figure 1:
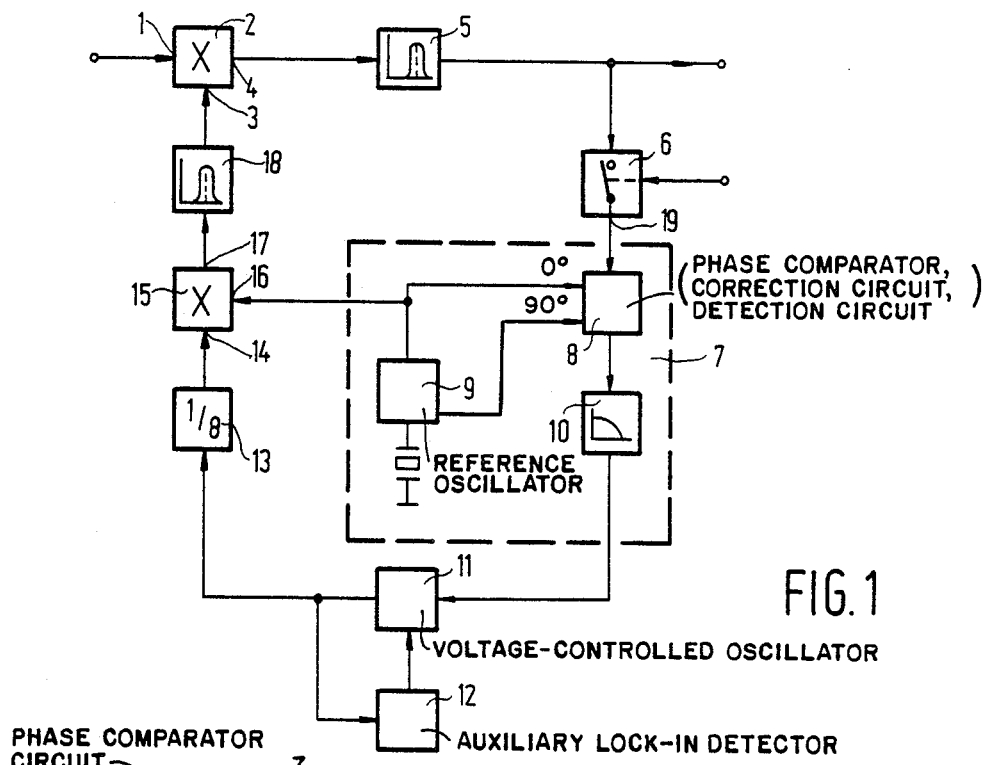
FIG. 1 shows a part of a video-recorder circuit comprising the circuit arrangement in accordance with the invention.

FIG. 1 shows a circuit arrangement for a video recorder in accordance with the VHS-PAL standard. A chrominance signal which is reproduced by means of the video heads, which is modulated on a first 627-kHz carrier, and which is band-limited in a low-pass filter having a cut-off frequency of 1.1 MHz is applied to the input 1 of a modulator 2. In the modulator 2 the chrominance signal modulated on the first carrier having a frequency of 627 kHz is converted to a second carrier having a frequency of 4.43 MHz. For this conversion a first carrier of 5.06 MHz is applied to a second input 3 of the modulator 2. The modulation product appearing on the output 4 of the modulator 2 comprises the chrominance signal modulated on the carrier having a frequency of 4.43 MHz and a signal component of higher frequency, which is rejected in the subsequent band-pass filter 5 having a mid frequency of 4.43 MHz. The output signal of the band-pass filter 5, which also constitutes the output signal of the circuit arrangement, is applied to a switch 6. The output 19 of the switch 6 is connected to the circuit arrangement 7 in accordance with the invention. The switch 6 is closed during the burst interval, i.e. during the interval in which the burst signal is available.

In the arrangement 7 the output signal of the switch 6 is applied to a circuit 8 which comprises a first phase comparator, a correction circuit and a detection circuit. The circuit 8 also receives a quartz-stabilized first oscillator signal having a frequency of 4.43 MHz and a second oscillator signal of the same frequency but 90° phase shifted relative to said first oscillator signal from a reference oscillator 9. The output signal of the circuit 8 forms a control signal which is applied to a voltage-controlled oscillator 11 via a low-pass filter 10, which like the reference oscillator 9 forms part of the circuit arrangement 7.

The oscillator 11, which supplies a further oscillator signal having a frequency of 5.016 MHz, is phase-controlled by the circuit arrangement 7. In order to prevent the oscillator from being pulled to another frequency than the desired frequency there is provided an auxiliary lock-in detector 12, which holds the voltage-controlled oscillator 11 at a frequency of approximately 5.016 MHz. The principle of the auxiliary lock-in detector is described in, for example, DE-PS No. 32 02 210.

The output of the oscillator 11 is connected to a frequency divider 13, which divides the frequency of the oscillator signal by eight. A signal having a frequency of 627 kHz appears on the output of the frequency divider 13 and is applied to a first input 14 of a mixer 15. The other input 16 of the mixer 15 receives an oscillator signal of a frequency of 4.43 MHz from the reference oscillator 9. A mixed signal containing the two frequency components of 5.06 MHz and 3.86 mMHz appears on the output 17 of the mixer mixer 15. This mixed signal is applied to the input 3 of the modulator 2 as the third carrier via a band-pass filter 18 which rejects the low-frequency signal component.

Figure 2:
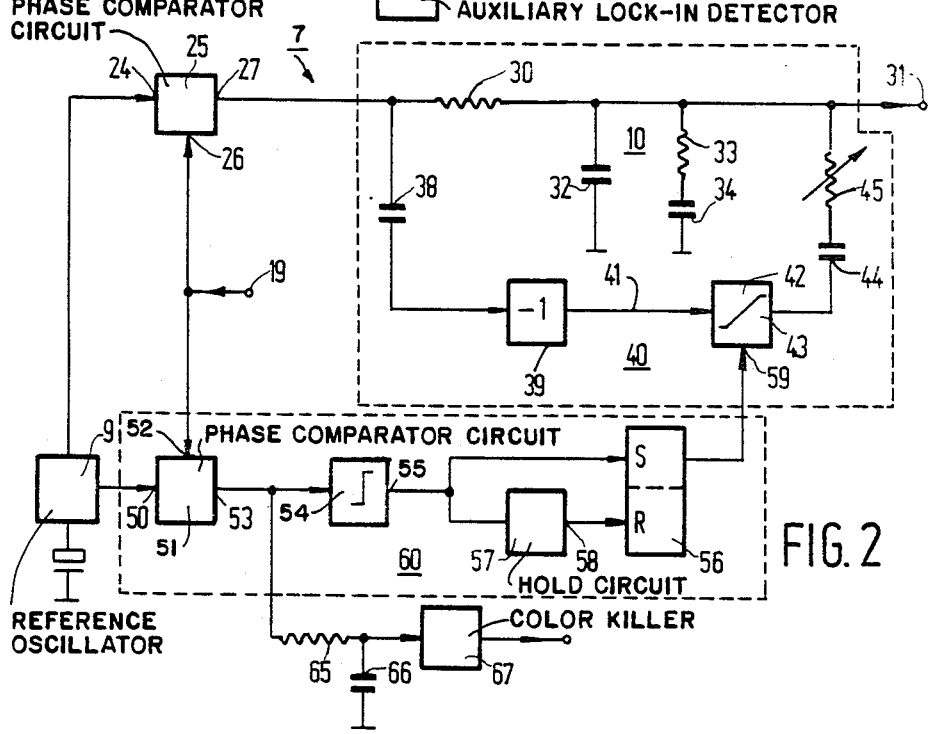
FIG. 2 shows an embodiment of the invention.

FIG. 2 shows a circuit arrangement 7 in accordance with the invention. The reference oscillator 9 supplies the first oscillator signal having a frequency of 4.43 MHz, which is applied to a first input 24 of a first phase-comparator circuit 25, whose second input 26 receives the burst signal from terminal 19. The phase-comparator circuit 25 compares the phase of first oscillator signal and the burst signal and produces on its output 27 an output signal corresponding to the phase difference between these two signals.

The output signal of the phase comparator circuit 25 is applied to the output terminal 31 via a resistor 30. The output terminal 31 is connected to a low-pass filter which comprises a capacitor 32 and a resistor 33 in series with a capacitor 34 arranged in parallel between the output terminal 31 and earth. The low-pass filter 10 serves for rejecting high-frequency components in the signal applied to the output terminal 31. Further, the output 27 of the phase-comparator circuit 25 is connected to an inverter 39 via a capacitor 38, which inverter forms part of a correction circuit 40. The correction circuit 40 further comprises an amplitude limiter 42 which is connected to the output 41 of the inverter 39 and which amplifies and limits the amplitude the output signal of the inverter 39, the resulting signal appearing on its output 43 as the correction signal. From the output 43 of the amplitude limiter 42 the correction signal is applied to the output terminal 31 via a capacitor 44 and a variable resistor 45 and is superimposed on the output signal of the phase-comparator circuit 25.

Figure 3:
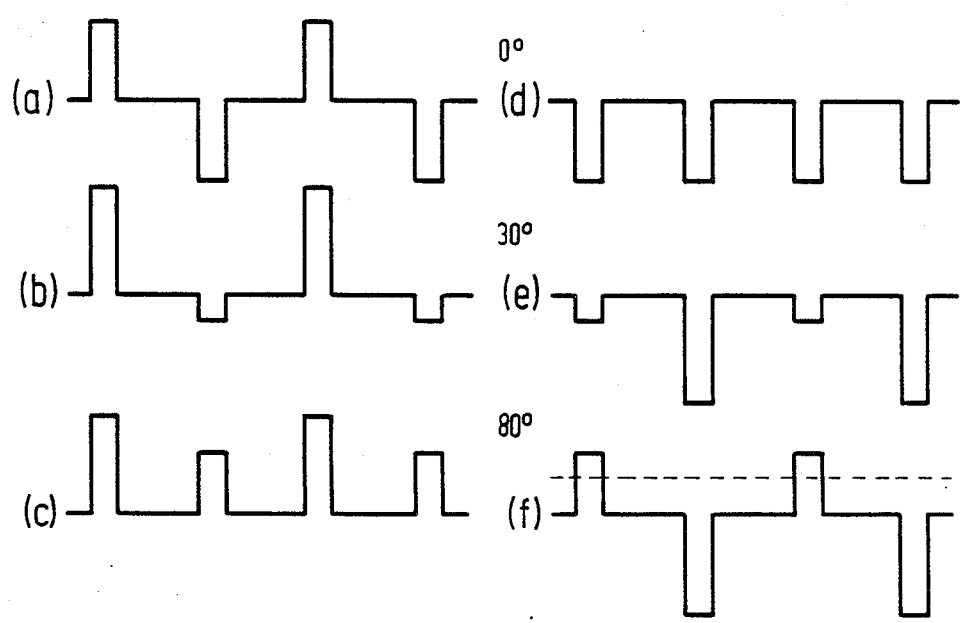
FIG. 3 is a diagram which serves to clarify FIG. 2.

In the case of a PAL-encoded television signal the phase of the burst signal changes 90° from line to line. In the chrominance section the burst signals have a phase shift of 135° and 225° relative to the color-difference signal U. This means that as a result of the phase alternation in the burst signal, the output signal of the first phase-comparator circuit contains an alternating signal whose average value is zero. Diagram a of FIG. 3 shows for example, an output signal of the phase-comparator circuit 25 when there is no phase difference (0°) between the first oscillator signal and the burst signal for four consecutive lines. By means of the correction circuit 40 a correction signal is generated, which signal is inverted relative to the output signal of the phase-comparator circuit 25 and which eliminates the alternating component in the output signal of the phase comparator circuit appearing on the output terminal 31. The amplitude limiter is adjusted in such a way that it exactly cancels the alternating signal component when there is no phase error.

In the present embodiment the correction signal is applied from the output 43 of the amplitude limiter 42 to the output terminal 31 via a capacitor 44 and a variable resistor 45. The capacitor 44 suppresses undesired direct currents between the output 43 of the amplitude limiter 42 and the output 27 of the phase comparator circuit 25. The amplitude of the correction signal can be adjusted by means of the variable resistor 45.

The reference oscillator 9 supplies the second oscillator signal, which is 90° phase-shifted relative to the first oscillator signal, to an input 50 of a second phase-comparator circuit 51, whose other input 52 receives the burst signal from the terminal 19. On its output 53 the phase-comparator circuit 51 produces an output signal which is representative of the phase error between the second oscillator signal and the burst signal. In diagrams d to f of FIG. 3 various output signals for four consecutive lines are shown for phase errors of 0°, 30° and 80°. Diagrams a to c of FIG. 3 show the corresponding output signal of the phase comparator circuit 25. The output 53 of the phase-comparator circuit 51 is connected to a threshold detector 54, which generates a pulse if the magnitude of the phase error between the first oscillator signal and the burst signal exceeds a specific value, for example 70°. In the present example the value of the output signal of the phase-comparator circuit 51 during every second line is then larger than the threshold value. Diagram f of FIG. 3 shows that every second pulse exceeds the threshold value, indicated in broken lines, for a phase error of 70°.

The output 55 of the threshold detector 54 is connected to a set input of an RS flip-flop 56 and to a hold circuit 57. The output 58 of the hold circuit 57 is connected to the reset input of an RS flip-flop. When two burst signals have appeared after the flip-flop 56 has been set, the hold circuit 57 generates a reset signal if the threshold detector 54 has not generated a further pulse, i.e. if the magnitude of the phase difference between the first oscillator signal and the burst signal is smaller than 70°. However, the set signal can also be generated at a later instant, for example after four subsequent lines. The phase-comparator circuit 51, the threshold detector 54, the hold circuit 57, and the RS flip-flop 56 constitute a detection circuit 60 which generate a disable signal.

After it has been set, the RS flip-flop 56 supplies the disable signal to an input 59 of the amplitude limiter 42. The disable signal prevents the amplitude limiter 42 from supplying a correction signal. The control signal on the output terminal 31 is then identical to the output signal of the phase-comparator circuit 25. When the correction signal is not supplied, the amplitude of the control signal increases, as can be seen in diagram c of FIG. 3, and the control speed in, for example, the circuit arrangement of FIG. 1 is increased. In the case of large phase differences the amplitude differences between two consecutive lines in the output signal of the phase-comparator circuit 25 are also smaller.

The output 53 of the phase-comparator circuit 51 is also connected to a resistor 65, whose other end is connected to an earthed capacitor 66. A color killer 67, which generates a color-killing signal, is connected to the junction point between the resistor 65 and the capacitor 66. The resistor 65 and the capacitor 66 form an integrator having a large time constant. The color killer 67 in known manner detects the output signal of this integrator and for a specific level of this signal it generates the color-killing signal to preclude color reproduction.

What is claimed is:

1. A circuit arrangement for controlling the frequency of an oscillator in a color television receiver or a video recording and/or reproducing apparatus, comprising a phase-comparator circuit having a first input for receiving a burst signal, a second input for receiving a first oscillator signal from a reference oscillator coupled to said second input, which phase-comparator circuit is constructed to produce a first output signal on an output depending on the phase difference between the color burst and the first oscillator signal, a signal-combination circuit for superimposing a correction signal on the first output signal and deriving therefrom a control signal for controlling the oscillator, the control signal being substantially independent of fluctuations as a result of the phase alternation of the burst signal every other line, a correction circuit for generating and amplitude limiting said correction signal comprising
    an inverter having an input coupled to the output of the phase-comparator circuit, for inverting the first output, signal, and
    an amplitude limiter, which is coupled to an output of the inverter, and there is also provided a detection circuit for disabling the correction circuit when the magnitude of the phase difference exceeds a predetermined limit value.

2. A circuit arrangement as claimed in claim 1, wherein the amplitude of the correction signal supplied by the amplitude limiter in the case of a phase error does not exceed the amplitude of the output signal of the inverter when there is no phase difference.

3. A circuit arrangement as claimed in claim 1, wherein the detection circuit comprises a phase-comparator circuit and a threshold detector which phase-comparator circuit generates a second output signal depending on the burst signal and a second oscillator signal generated in the reference oscillator, which second oscillator signal has a fixed phase difference relative to the first oscillator signal, a disable signal for disabling the correction circuit being derived from the threshold detector when the magnitude of the phase difference exceeds a predetermined limit.

4. A circuit arrangement for controlling a frequency-dependent oscillator as claimed in claim 3, wherein the output of the threshold detector is connected to the set input of a multivibrator circuit which generates the disable signal.

5. A circuit arrangement as claimed in claim 4, wherein the output of the second phase-comparator circuit is coupled to a color killer.

6. A circuit arrangement as claimed in claim 2, wherein the detection circuit comprises a phase-comparator circuit and a threshold detector which phase-comparator circuit generates a second output signal depending on the burst signal and a second oscillator signal generated in the reference oscillator, which second oscillator signal has a fixed phase difference relative to the first oscillator signal, a disable signal for disabling the correction circuit being derived from the threshold detector when the magnitude of the phase difference exceeds a predetermined limit.

7. A circuit arrangement for controlling a frequency-dependent oscillator as claimed in claim 6, wherein the output of the threshold detector is connected to the set input of a multivibrator circuit which generates the disable signal.

8. A circuit arrangement as claimed in claim 7, wherein the output of the second phase-comparator circuit is coupled to a color killer.

* * * * *

UNITED STATES PATENT AND TRADEMARK OFFICE
CERTIFICATE OF CORRECTION

PATENT NO. : 4,758,879
DATED : July 19, 1988
INVENTOR(S) : Karl-Heinz Matthies

It is certified that error appears in the above-identified patent and that said Letters Patent is hereby corrected as shown below:

IN THE TITLE PAGE

Insert the foreign filing notification

--[30]  Foreign Application Priority Data

Dec. 18, 1985[DE]  Fed. Rep. of Germany...3544675--

Signed and Sealed this

Twenty-first Day of March, 1989

Attest:

DONALD J. QUIGG

*Attesting Officer*   *Commissioner of Patents and Trademarks*